(12) United States Patent
Chao et al.

(10) Patent No.: US 7,932,740 B1
(45) Date of Patent: Apr. 26, 2011

(54) DRIVING CIRCUIT WITH LOAD CALIBRATION AND THE METHOD THEREOF

(75) Inventors: Kuan-Hua Chao, Taipei County (TW); Jeng-Horng Tsai, Kao-Hsiung (TW); Tse-Hsiang Hsu, Hsin-Chu (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 113 days.

(21) Appl. No.: 12/187,361

(22) Filed: Aug. 6, 2008

Related U.S. Application Data

(60) Provisional application No. 61/017,802, filed on Dec. 31, 2007.

(51) Int. Cl.
*H03K 19/003* (2006.01)

(52) U.S. Cl. ............... 326/30; 326/26; 326/86; 327/108

(58) Field of Classification Search .................. 327/108, 327/157, 291, 390, 539; 326/30, 112, 115, 326/119, 121, 127, 21–29, 86

See application file for complete search history.

(56) References Cited

U.S. PATENT DOCUMENTS

| 6,232,815 | B1 * | 5/2001 | Turvey ............... 327/291 |
| 6,731,155 | B2 * | 5/2004 | Hakkarainen et al. ......... 327/390 |
| 6,812,735 | B1 * | 11/2004 | Pham .............. 326/30 |
| 6,911,875 | B2 | 6/2005 | Lee et al. |
| 6,940,303 | B2 * | 9/2005 | Vargas ............ 326/30 |
| 7,019,584 | B2 * | 3/2006 | Bartel et al. ............ 327/539 |
| 7,248,079 | B2 * | 7/2007 | Bhattacharya et al. ........ 326/83 |
| 7,492,197 | B2 * | 2/2009 | Lin et al. ............. 327/157 |
| 2007/0024317 | A1 * | 2/2007 | Hansen ............. 326/30 |
| 2009/0146751 | A1 * | 6/2009 | Pernia et al. ............. 331/117 R |
| 2009/0206886 | A1 * | 8/2009 | Chang et al. ............ 327/108 |

* cited by examiner

*Primary Examiner* — Vibol Tan
(74) *Attorney, Agent, or Firm* — Winston Hsu; Scott Margo (57) ABSTRACT

A driving circuit includes: a first reference current source injects a reference current; each first switch unit is coupled between the first reference current source and one of first and second output ports; a second reference current source sinks the reference current; each second switch unit is coupled between the second reference current source and one of the output ports; a load unit is coupled between the output ports, and a common voltage is applied onto the load unit; and a calibration module calibrates an impedance of the load unit according to a voltage at one of the output ports, and the voltage is generated due to the reference current passing through one of the first switch units, the load unit, and one of the second switch units.

10 Claims, 5 Drawing Sheets

DRIVING CIRCUIT WITH LOAD CALIBRATION AND THE METHOD THEREOF

CROSS REFERENCE TO RELATED APPLICATIONS

This application claims the benefit of U.S. Provisional Application No. 61/017,802, filed on Dec. 31, 2007 and is included herein by reference.

BACKGROUND

The present invention relates to a driving scheme, and more particularly, to a driving circuit and a related method for calibrating an impedance of a load unit in the driving circuit.

Generally speaking, an interface standard for high-speed transmission, e.g. a driving circuit for outputting differential signals to drive a following stage, specifies an acceptable range for an impedance of a load unit in the driving circuit. When the driving circuit is used, it is necessary for designers to make the impedance fall within the acceptable range, to ensure the driving circuit operates correctly. In practical terms, however, the impedance of the resistance element usually varies from the acceptable range due to variation caused by process and environmental factors. Accordingly, the load unit is often implemented by adjustable resistance element(s), and a calibration scheme used for adjusting the impedance of the load unit is required.

SUMMARY

One of the objectives of the present invention is to provide a driving circuit and related method for calibrating an impedance of a load unit in the driving circuit, to decrease production cost and improve calibration accuracy.

According to an embodiment of the present invention, a driving circuit is disclosed. The driving circuit comprises a first reference current source, two first switch units, a second reference current source, two second switch units, a load unit, and a calibration module. The first reference current source is used for injecting a reference current. Each of the two switch units is coupled between the first reference current source and one of a first output port and a second output port. The second reference current source is used for sinking the reference current. Each of the second switch units is coupled between the second reference current source and one of the first output port and the second output port. The load unit is coupled between the first output port and the second output port, and a common voltage is applied onto the load unit. The calibration module is used for calibrating an impedance of the load unit according to a voltage at one of the output ports, wherein the voltage is generated due to the reference current passing through one of the two first switch units, the load unit and one of the two second switch units.

According to another embodiment of the present invention, a driving circuit is further disclosed. The driving circuit comprises a reference current source, a load unit, a first switch unit, a second switch unit, and a calibration module. The load unit is coupled between a first output port and a second output port, and a bias voltage is applied onto the load unit. The first switch unit is coupled between the first output port and the reference current source, and the second switch unit is coupled between the second output port and the reference current source. The calibration module is used for calibrating an impedance of the load unit according to a voltage at one of the output ports while at least one of the first switch unit and the second switch unit is turned on.

According to an embodiment of the present invention, a method for calibrating an impedance of a load unit utilized in an H-box driving circuit is disclosed. The H-box driving circuit comprises two first switch units, two second switch units, and the load unit. Each of the first switch units is coupled between a first reference current source and one of a first output port and a second output port, and each of the second switch units is coupled between a second reference current source and one of the first output port and the second output port. The load unit is coupled between the first output port and the second output port, and a common voltage is applied into the load unit. The method comprises: turning on one of the two first switch units and one of the two second switch units, wherein the turned-on switch units are of the same phase; injecting a reference current from the first reference current source to the second reference current source sequentially through the turned-on first switch unit, the load unit and the turned-on second switch unit; and calibrating the impedance of the load unit according to a voltage at one of the output ports, wherein the voltage is generated due to the reference current.

According to another embodiment of the present invention, a method for calibrating an impedance of a load unit utilized in a driving circuit is disclosed. The driving circuit comprises a reference current source for generating a reference current, the load unit, a first switch unit, and a second switch unit. The load unit is coupled between a first output port and a second output port. The first switch unit is coupled between the first output port and the reference current source, and the second switch unit is coupled between the second output port and the reference current source, wherein a bias voltage is applied onto the load unit. The method comprises: turning on at least one of the first switch unit and the second switch unit; and calibrating the impedance of the load unit according to a voltage at one of the output ports.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

In embodiments of the present invention, reference current source(s) originally positioned within a driving circuit can be utilized for providing an accurate reference current for calibration purposes, and a calibration module can directly calibrate the impedance of a load unit in the driving circuit when the accurate reference current passes through the load unit. Detailed description is provided in the following.

Figure 1A:
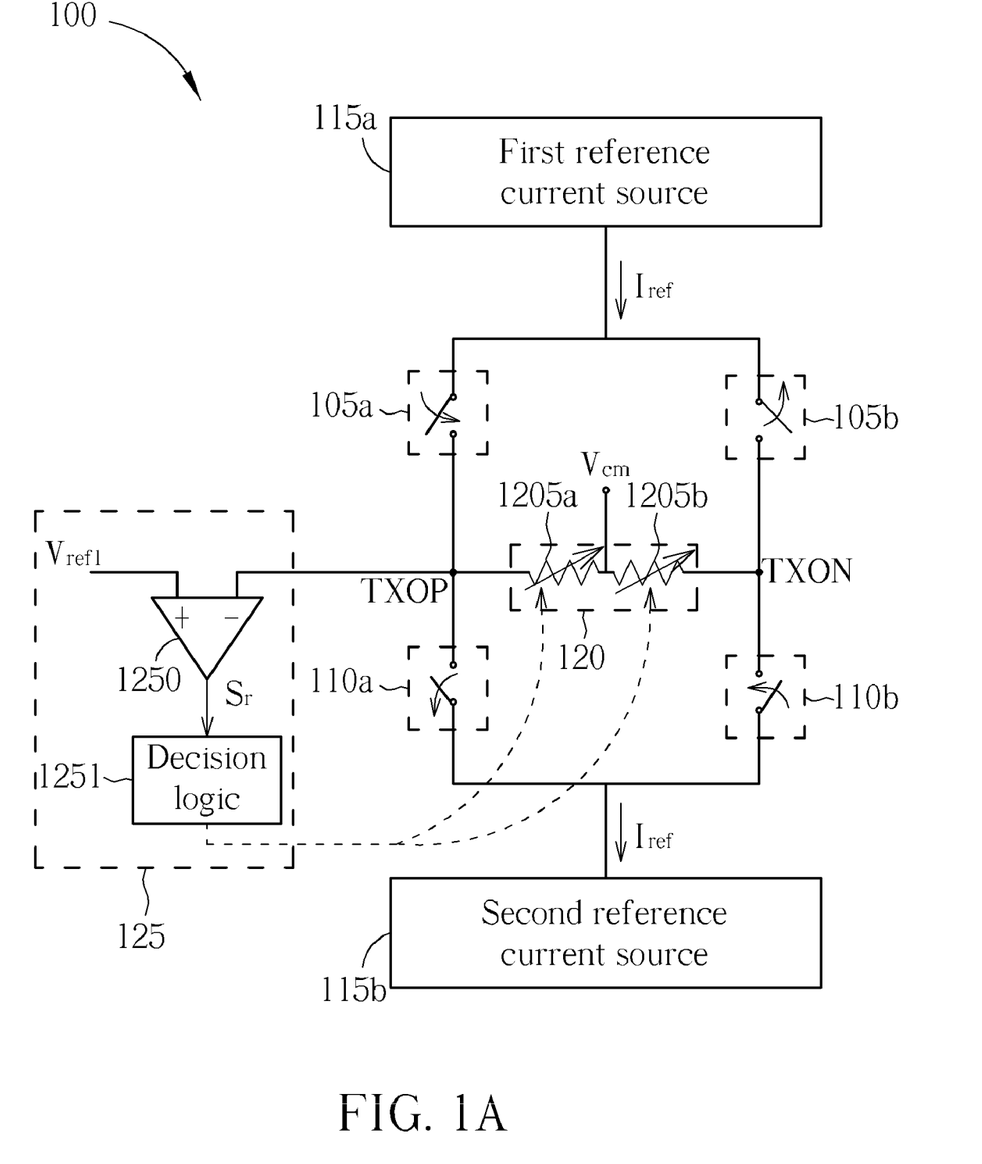
FIG. 1A is a diagram of a driving circuit according to a first embodiment of the present invention, which is illustrated at a certain moment of its operation.

FIG. 1A is a diagram of a driving circuit 100 according to a first embodiment of the present invention. The driving circuit 100 includes first switch units 105a and 105b, second switch units 110a and 110b, a first reference current source 115a, a second reference current source 115b, a load unit 120, and a calibration module 125. The first switch unit 105a and the second switch unit 110a are coupled to a first output port TXOP, and the first switch unit 105b and the second switch unit 110b are coupled to a second output port TXON. The first switch units 105a, 105b, and the second switch units 110a, 110b can be implemented, for example, by transistors. The load unit 120 further includes two adjustable resistance elements 1205a and 1205b. The adjustable resistance element 1205a is coupled between the first output port TXOP and a common voltage $V_{cm}$ while the adjustable resistance element 1205b is coupled between the second output port TXON and the common voltage $V_{cm}$. The common voltage $V_{cm}$ is applied onto the load unit 120. The adjustable resistance elements 1205a and 1205b may respectively have target resistance values, and in this embodiment they have the same target resistance value $R_{out}$. To ensure the impedances of the adjustable resistance elements 1205a and 1205b fall within an acceptable range of the target resistance value $R_{out}$ when the driving circuit 100 operates practically, the calibration module 125 is utilized for calibrating the impedances. The calibration module 125 includes a comparator 1250 and a decision logic 1251. Briefly, the calibration module 125 calibrates the impedances according to a voltage at the first output port TXOP in this embodiment. The description of the calibration operation is provided below.

When the driving circuit 100 is enabled, being operated in an H-box driving scheme, one of the first switch units 105a and 105b and one of the second switch units 110a and 110b, which are of the same phase, are periodically turned on and off together. For example, at one moment during the H-box driving, the first switch unit 105a and the second switch unit 110b are turned on, and the first switch unit 105b and the second switch unit 110a are turned off. The first reference current source 115a injects an accurate reference current $I_{ref}$, and the injected reference current $I_{ref}$ sequentially passes through the turned-on first switch unit 105a, the adjustable resistance elements 1205a, 1205b, and the turned-on second switch unit 110b. The second reference current source 115b then sinks the injected reference current $I_{ref}$ from the turned-on second switch unit 110b. Because of the common voltage $V_{cm}$, if the impedance of the adjustable resistance elements 1205a ideally does not vary from the acceptable range, the voltage at the first output port TXOP should equal or approximate a reference voltage $V_{ref1}$ in the following equation (1):

$$V_{ref1}=V_{cm}+I_{ref} \times R_{out} \quad (1)$$

The reference voltage $V_{ref1}$ can be predetermined by the common voltage $V_{cm}$, the reference current $I_{ref}$, and the target impedance $R_{out}$ of the adjustable resistance element 1205a, as mentioned above. The reference voltage $V_{ref1}$ is coupled to an input of the comparator 1250, and the voltage at the first output port TXOP, which is coupled to another input of the comparator 1250, is located between the first reference current source 115a and the common voltage $V_{cm}$. By comparing the voltage at the first output port TXOP with the reference voltage $V_{ref1}$, the decision logic 1251 can appropriately calibrate the impedance of the adjustable resistance element 1205a according to a resultant signal $S_r$ generated by the comparator 1250. Particularly, when the resultant signal $S_r$ indicates the voltage at the first output port TXOP is higher than the reference voltage $V_{ref1}$, this means that the actual impedance of the adjustable resistance elements 1205a is higher than the target resistance value $R_{out}$, and therefore the decision logic 1251 is arranged to send a control signal to decrease the impedance. When the resultant signal $S_r$ indicates the voltage at the first output port TXOP is lower than the reference voltage $V_{ref1}$, the actual impedance of the adjustable resistance elements 1205a is lower than the target resistance value $R_{out}$ and therefore the decision logic 1251 is arranged to send the control signal to increase the impedance. It should be noted that, in this embodiment, the adjustable resistance elements 1205a and 1205b are assumed to be resistor arrays produced by the same process. That is, for the resistor arrays, the deviations of the impedances should be similar. The calibration module 125 is therefore able to simultaneously calibrate the two adjustable resistance elements 1205a and 1205b with the same adjustment. In other embodiments, the adjustable resistance elements 1205a and 1205b may be resistor arrays produced by different processes.

Figure 1B:
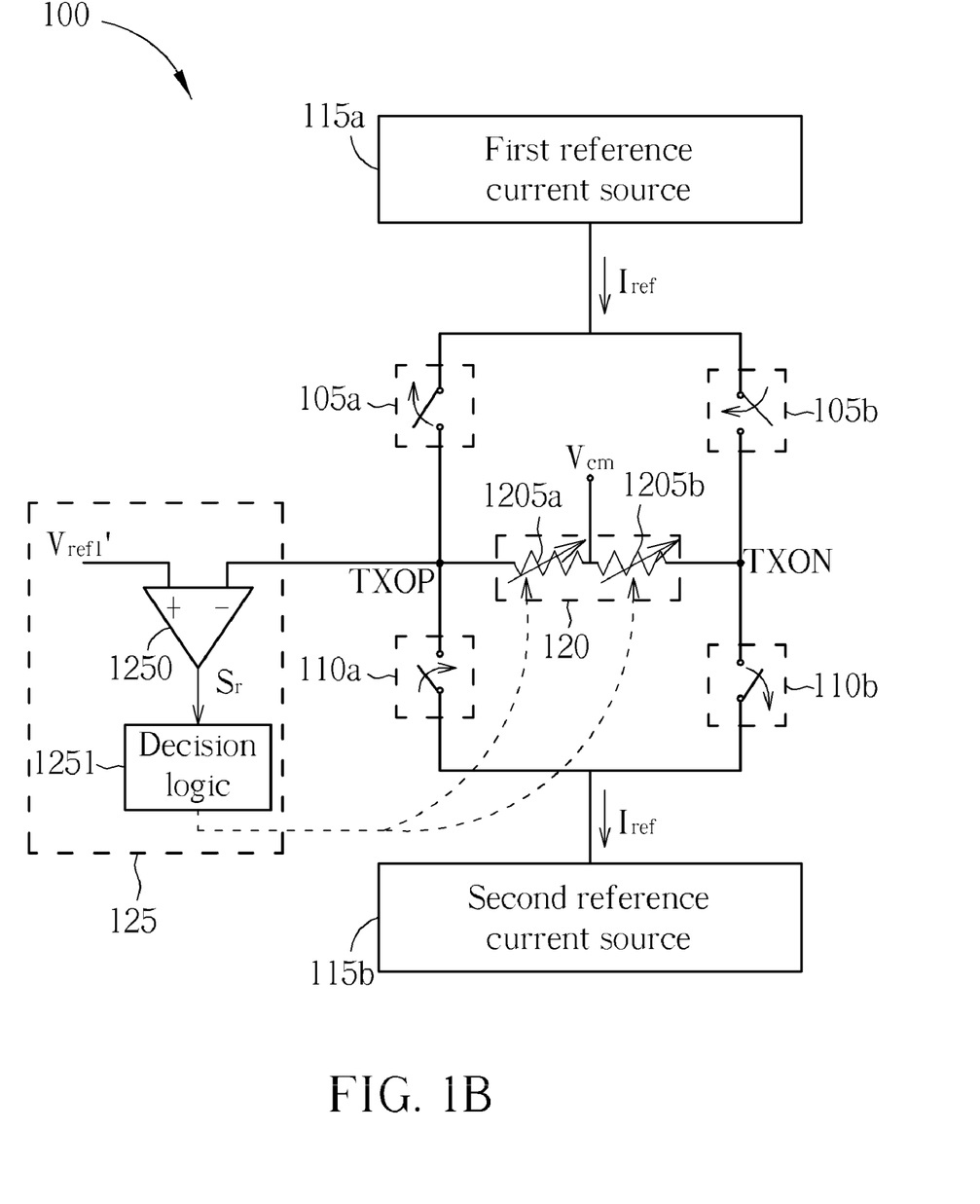
FIG. 1B is a diagram of the driving circuit shown in FIG. 1A operating at another moment of its operation.

At another moment during the H-box driving of the driving circuit 100, the first switch unit 105b and the second switch unit 110a are turned on, and the first switch unit 105a and the second switch unit 110b are turned off, as shown in FIG. 1B. The turned-on first switch unit 105b and the turned-on second switch unit 110a are of the same phase. The injected reference current $I_{ref}$ sequentially passes through the turned-on first switch unit 105b, the adjustable resistance elements 1205b, 1205a, and the turned-on second switch unit 110a. Accordingly, if the impedance of the adjustable resistance element 1205a ideally does not vary from the acceptable range, the voltage at the first output port TXOP should equal or approximate a reference voltage $V_{ref1}'$ in the following equation (2):

$$V_{ref1}'=V_{cm}-I_{ref} \times R_{out} \quad (2)$$

Similarly, the reference voltage $V_{ref1}'$ can be also predetermined by the common voltage $V_{cm}$, the reference current $I_{ref}$, and the target impedance $R_{out}$ of the adjustable resistance element 1205a, and is coupled to the input of the comparator 1250. Under this condition, the voltage at the first output port TXOP is located between the common voltage $V_{cm}$ and the second reference current source 115b. By comparing the voltage at the first output port TXOP with the reference voltage $V_{ref1}'$, the decision logic 1251 can also appropriately calibrate the impedance of the adjustable resistance element 1205a according to a resultant signal $S_r$, which is generated by the comparator 1250. When the resultant signal $S_r$ indicates the voltage at the first output port TXOP is lower than the reference voltage $V_{ref1}'$, this means that the actual impedance of the adjustable resistance element 1205a is higher than the target resistance value $R_{out}$, and therefore the decision logic 1251 is arranged to send a control signal to decrease the impedance. When the resultant signal $S_r$ indicates the voltage at the first output port TXOP is higher than the reference voltage $V_{ref1}'$, the actual impedance of the adjustable resistance elements 1205a is lower than the target resistance value $R_{out}$, and therefore the decision logic 1251 is arranged to send the control signal to increase the impedance.

Additionally, in another embodiment not explicitly illustrated, the calibration module 125 can be alternatively used to calibrate the impedances according to a voltage at the second output port TXON of the driving circuit 100. While operating the driving circuit in the H-box driving scheme, the description of the calibration operation dependent on the voltage at the second output port TXON is similar with that dependent on the voltage at the first output port TXOP as mentioned above, and thus is omitted for clarity. This modification also obeys the spirit of the present invention.

Figure 2:
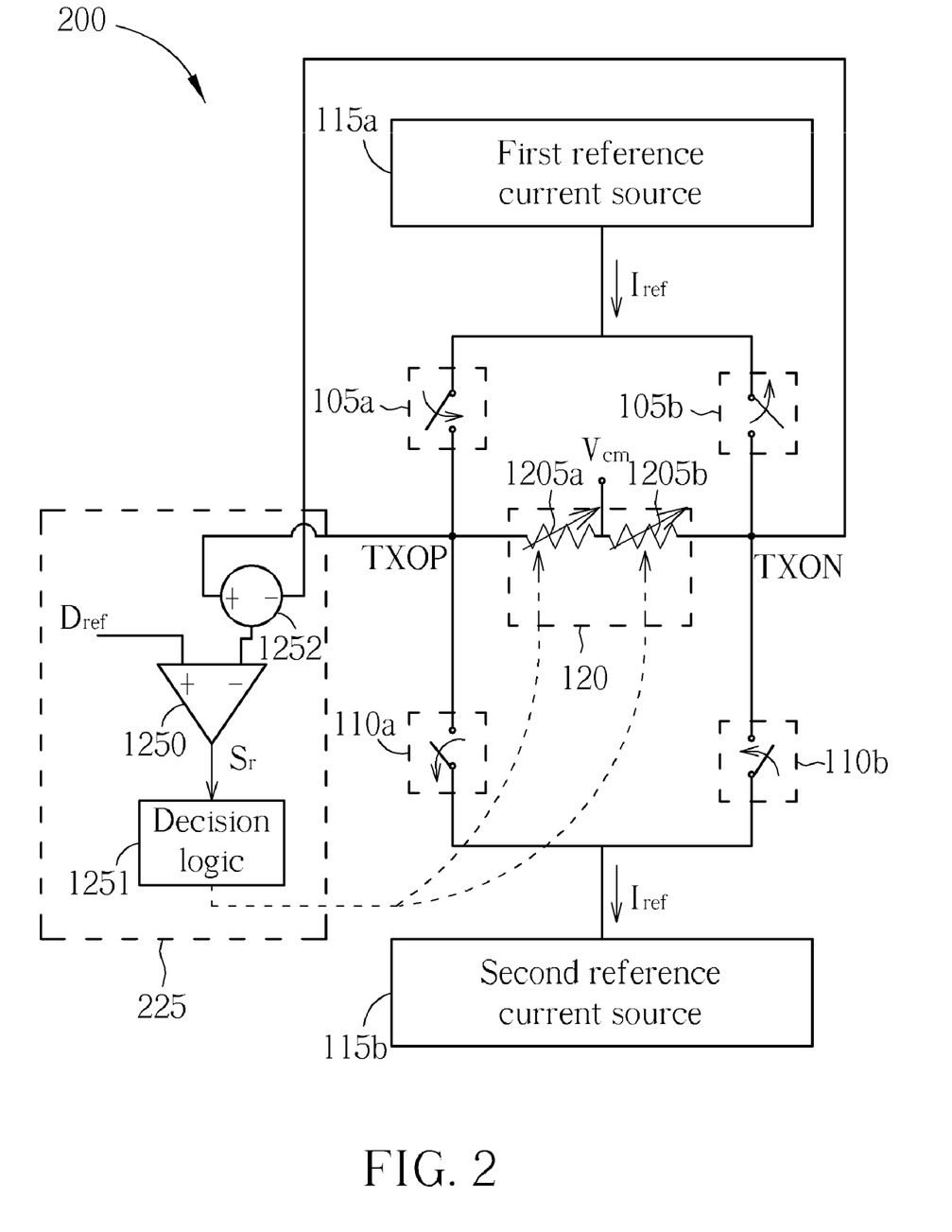
FIG. 2 is a diagram of a driving circuit according to a second embodiment of the present invention, which is illustrated at a certain moment of its operation.

FIG. 2 is a diagram of a driving circuit 200 according to a second embodiment of the present invention. In the driving circuit 200, the calibration module 225 further includes a substrater 1252 in addition to the comparator 1250 and decision logic 1251. The inputs of the substrater 2152 are coupled to the first and second output ports TXOP and TXON, respectively. The actual voltage difference between the first and second output ports TXOP and TXON is transmitted to an input of the comparator 1250, and the reference current $I_{ref}$ passes through the adjustable resistance elements 1205a and 1205b while the first switch unit 105a and the second switch unit 110b are turned on, for example. If the impedances of the two adjustable resistance elements 1205a and 1205b ideally do not vary from the acceptable range, the actual voltage difference should equal or approximate a reference voltage difference $D_{ref}$ described below:

$$D_{ref} = I_{ref} \times 2 \times R_{out} \quad (3)$$

The reference voltage difference $D_{ref}$ is coupled to an input of the comparator 1250, and $R_{out}$ is a target impedance of each of the adjustable resistance elements 1205a and 1205b where the adjustable resistance elements 1205a and 1205b are assumed to have the same impedance. By comparing the actual voltage difference with the reference voltage difference $D_{ref}$, the decision logic 1251 is able to appropriately calibrate the impedances according to a resultant signal $S_r$, which is generated by the comparator 1250. When the resultant signal $S_r$ indicates the actual voltage difference is higher than the reference voltage difference $D_{ref}$, this means that the actual impedances of the adjustable resistance elements 1205a and 1205b are higher than the target resistance value $R_{out}$, and therefore the decision logic 1251 is arranged to send a control signal to decrease the impedances. When the resultant signal $S_r$ indicates the actual voltage difference is lower than the reference voltage difference $D_{ref}$, the actual impedances of the adjustable resistance elements 1205a and 1205b are lower than the target resistance value $R_{out}$ and therefore the decision logic 1251 is arranged to send the control signal to increase the impedances.

Figure 3A:
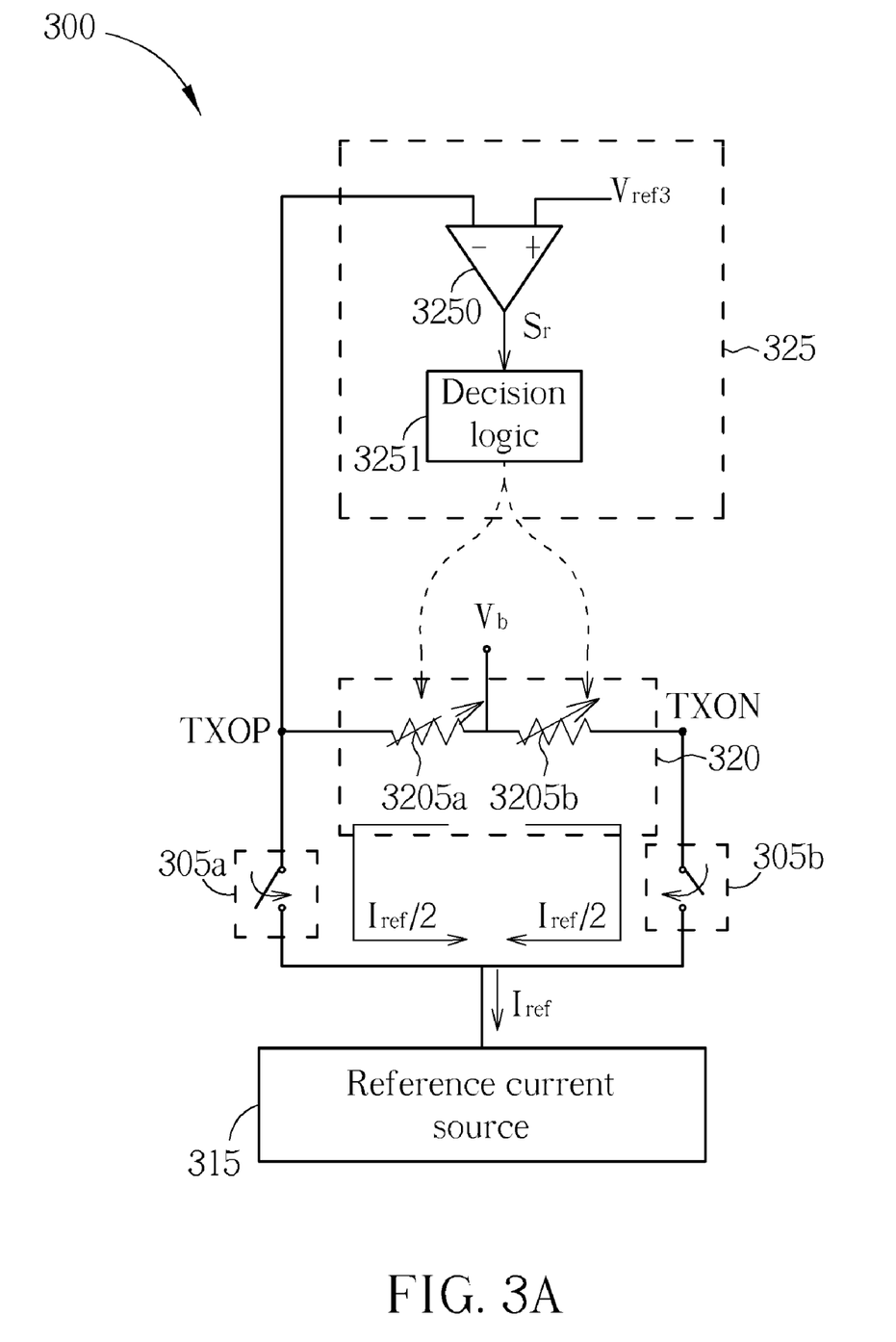
FIG. 3A is a diagram of a driving circuit according to a third embodiment of the present invention.

FIG. 3A is a diagram of a driving circuit 300 according to a third embodiment of the present invention. The driving circuit 300 includes switch units 305a, 305b, a reference current source 315, a load unit 320, and a calibration module 325. The switch units 305a and 305b are respectively coupled to the first and second output ports TXOP and TXON, and can be implemented by transistors. The load unit 320 includes two adjustable resistance elements 3205a and 3205b, and the adjustable resistance elements 3205a and 3205b may respectively have target resistance values, and in this embodiment they have the same target resistance value $R_{out}$. To ensure the actual impedances of the adjustable resistance elements 3205a and 3205b fall within an acceptable range of the target resistance value $R_{out}$ when the driving circuit 300 operates practically, the calibration module 325 is utilized for calibrating the impedances. The calibration module 325 includes a comparator 3250 and a decision logic 3251. The calibration module 325 calibrates the impedances according to a voltage at the first output port TXOP in this embodiment.

When the driving circuit 300 is enabled, the switch units 305a and 305b are periodically turned on and off. In this embodiment, the bias voltage $V_b$ is at a higher voltage level and the reference current source 315 is assumed to sink an accurate reference current $I_{ref}$, so one half of the reference current $I_{ref}$ passes through the adjustable resistance element 3205a and turned-on switch unit 305a while the other half passes through the adjustable resistance element 3205b and turned-on switch unit 305b. If the impedances of the adjustable resistance elements 3205a and 3205b ideally do not vary from the acceptable range, the voltage at the first output port TXOP should equal or approximate a reference voltage $V_{ref3}$ in the following equation (4):

$$V_{ref3} = V_b - I_{ref} \times R_{out}/2 \quad (4)$$

The reference voltage $V_{ref3}$ can be predetermined by the bias voltage $V_b$, the reference current $I_{ref}$, and the target impedances $R_{out}$ of each of the adjustable resistance elements 3205a and 3205b. The reference voltage $V_{ref3}$ is coupled to an input of the comparator 3250. By comparing the voltage at the first output port TXOP with the reference voltage $V_{ref3}$, the decision logic 3251 is able to appropriately calibrate the impedances of the adjustable resistance elements 3205a and 3205b according to a resultant signal $S_r$ generated by the comparator 3250. When the resultant signal $S_r$ indicates the voltage at the first output port TXOP is higher than the reference voltage $V_{ref3}$, this means that the actual impedances are lower than the target resistance value $R_{out}$, and therefore the decision logic 3251 is arranged to send a control signal to increase the impedances. When the resultant signal $S_r$ indicates the voltage at the first output port TXOP is lower than the reference voltage $V_{ref3}$, the actual impedances are higher than the target resistance value $R_{out}$ and therefore the decision logic 3251 is arranged to send the control signal to decrease the impedances.

Figure 3B:
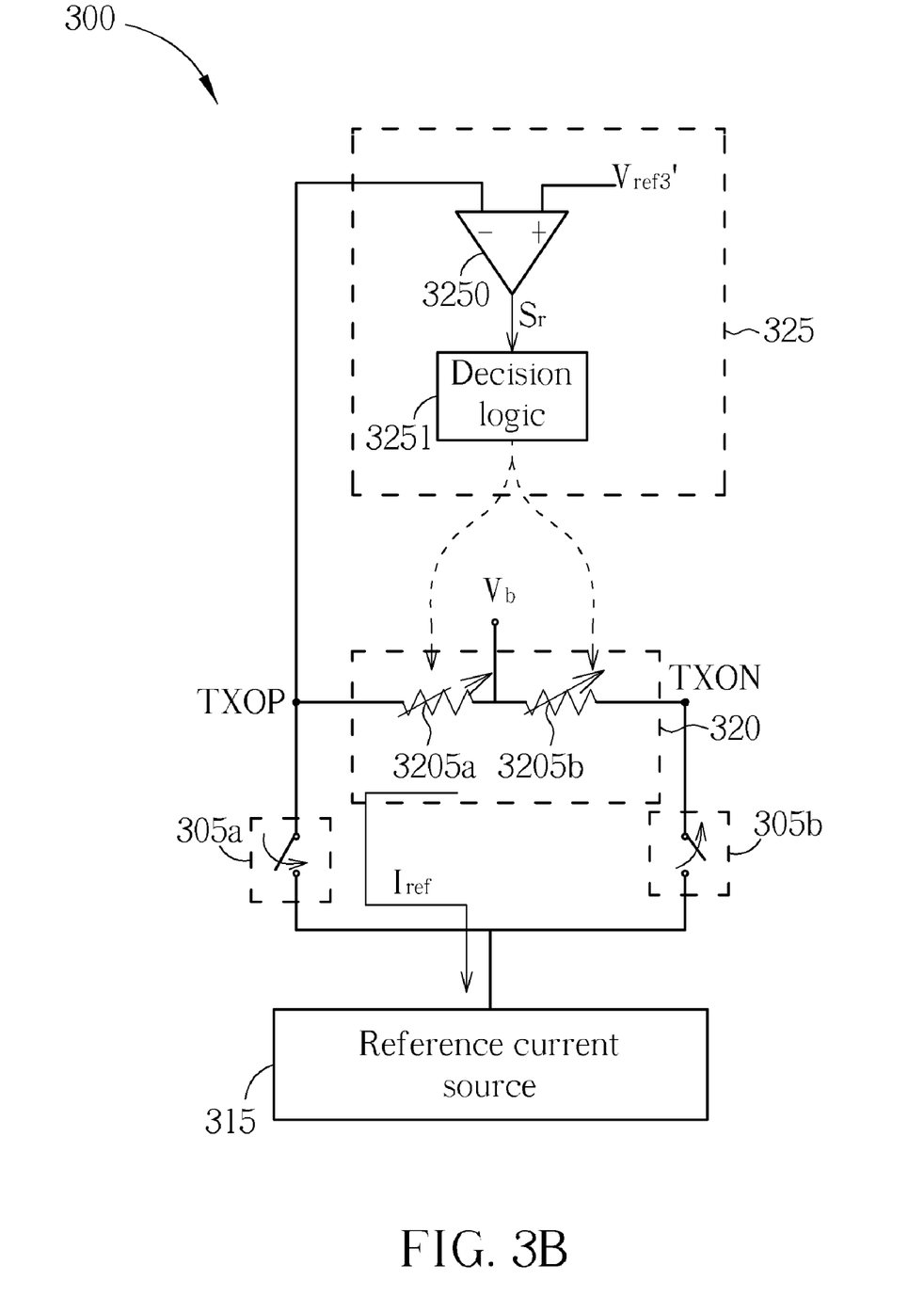
FIG. 3B is a diagram of the driving circuit shown in FIG. 3A operating at another moment of its operation.

Moreover, in another embodiment, when the driving circuit 300 is enabled, only one of the switch units 305a and 305b, such as the switch unit 305a, is turned on (as shown in FIG. 3B). In this situation, the reference current $I_{ref}$ only passes through the adjustable resistance element 3205a and the turned-on switch unit 305a. If the impedance of the adjustable resistance elements 3205a ideally does not vary from the acceptable range, the voltage at the first output port TXOP should equal or approximate a reference voltage $V_{ref3}'$ in the following equation (5):

$$V_{ref3}' = V_b - I_{ref} \times R_{out} \quad (5)$$

Similarly, the reference voltage $V_{ref3}'$ can be predetermined by the bias voltage $V_b$, the reference current $I_{ref}$, and the target impedance $R_{out}$ of the adjustable resistance element 3205a. The reference voltage $V_{ref3}'$ is coupled to an input of the comparator 3250. By comparing the voltage at the first output port TXOP with the reference voltage $V_{ref3}'$, the decision logic 3251 is able to appropriately calibrate the impedances of the adjustable resistance elements 3205a and 3205b according to a resultant signal $S_r$, which is generated by the comparator 3250. In one example, the adjustable resistance elements 3205a and 3205b are resistor arrays produced by the same process. When the resultant signal $S_r$ indicates the voltage at the first output port TXOP is higher than the reference voltage $V_{ref3}'$, the actual impedances are lower than the target resistance value $R_{out}$ and therefore the decision logic 3251 is arranged to send a control signal to increase the impedances. When the resultant signal $S_r$ indicates the voltage at the first output port TXOP is lower than the reference voltage $V_{ref3}'$, the actual impedances are higher than the target resistance value $R_{out}$ and therefore the decision logic 3251 is arranged to send the control signal to decrease the impedances.

Furthermore, in other embodiments (not illustrated), the bias voltage $V_b$ may be at a lower voltage level, and the reference current source 315 may be arranged to provide a reference current $I_{ref}$. That is, the direction of current $I_{ref}$ or $I_{ref}/2$ in these other embodiments is opposite to that in the embodiment as illustrated in FIG. 3A or 3B. For example, when the bias voltage $V_b$ is at a lower voltage level and the reference current source 315 provides a reference current $I_{ref}$, the current $I_{ref}/2$ sequentially passes through the turned-on switch unit 305a and the adjustable resistance element 3205a; when the bias voltage $V_b$ is at a higher voltage level and the reference current source 315 sinks a reference current $I_{ref}$ (as illustrated in FIG. 3A), the current $I_{ref}/2$ sequentially passes through the adjustable resistance element 3205a and the turned-on switch unit 305a.

Referring to the embodiments as stated above, the reference current source 315 can be arranged to generate a reference current for, either provide to or sink from, the turned-on switch unit and the adjustable resistance element, and the $I_{ref}$ or $I_{ref}/2$ may be positive or negative in the above two equations (4) and (5) according to different arrangements.

Accordingly, in the embodiments of the present invention, the calibration module can calibrate the impedance of the load unit when the accurate reference current passes through the load unit, instead of adjusting the impedance of the load unit according to a calibration result derived from the replica resistor array. Furthermore, the replica resistor array for calibration used in prior art has to been produced by the same process as the resistor array(s) of the load unit, and thus the embodiments can decrease the product cost and improve calibration accuracy.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A driving circuit, comprising:
   a first reference current source, for injecting a reference current;
   two first switch units, each coupled between the first reference current source and one of a first output port and a second output port;
   a second reference current source, for sinking the reference current;
   two second switch units, each coupled between the second reference current source and one of the first output port and the second output port;
   a load unit, coupled between the first output port and the second output port, wherein a common voltage is applied onto the load unit; and
   a calibration module, for calibrating an impedance of the load unit according to a voltage at one of the output ports, wherein the voltage is generated due to the reference current passing through one of the two first switch units, the load unit and one of the two second switch units;
   wherein the calibration module is arranged to compare the voltage at one of the output ports with a predetermined reference voltage to generate a resultant signal, and to calibrate the impedance of the load unit according to the resultant signal; and, the load unit comprises two adjustable resistance elements each coupled between the common voltage and one of the first output port and the second output port; and when the voltage at one of the output ports is located between the first reference current source and the common voltage, the common voltage $V_{cm}$, the predetermined reference voltage $V_{ref}$, and the reference current $I_{ref}$ satisfy:

$V_{ref} = V_{cm} + I_{ref} \times Z;$ wherein Z is a target impedance of one of the two adjustable resistance elements.

2. A driving circuit, comprising:
   a first reference current source, for injecting a reference current;
   two first switch units, each coupled between the first reference current source and one of a first output port and a second output port;
   a second reference current source, for sinking the reference current;
   two second switch units, each coupled between the second reference current source and one of the first output port and the second output port;
   a load unit, coupled between the first output port and the second output port, wherein a common voltage is applied onto the load unit; and
   a calibration module, for calibrating an impedance of the load unit according to a voltage at one of the output ports, wherein the voltage is generated due to the reference current passing through one of the two first switch units, the load unit and one of the two second switch units;
   wherein the calibration module is arranged to compare the voltage at one of the output ports with a predetermined reference voltage to generate a resultant signal, and to calibrate the impedance of the load unit according to the resultant signal; and, the load unit comprises two adjustable resistance elements each coupled between the common voltage and one of the first output port and the second output port; and when the voltage at one of the output ports is located between the common voltage and the second reference current source, the common voltage $V_{cm}$, the predetermined reference voltage $V_{ref}$, and the reference current $I_{ref}$ satisfy:

$V_{ref} = V_{cm} - I_{ref} \times Z;$ wherein Z is a target impedance of one of the two adjustable resistance elements.

3. A driving circuit, comprising:
   a first reference current source, for injecting a reference current;
   two first switch units, each coupled between the first reference current source and one of a first output port and a second output port;
   a second reference current source, for sinking the reference current;
   two second switch units, each coupled between the second reference current source and one of the first output port and the second output port;
   a load unit, coupled between the first output port and the second output port, wherein a common voltage is applied onto the load unit and
   a calibration module, for calibrating an impedance of the load unit according to a voltage at one of the output ports, wherein the voltage is generated due to the reference current passing through one of the two first switch units, the load unit and one of the two second switch units;

wherein the calibration module is arranged to compare a voltage difference between the first and second output ports with a reference voltage difference to generate a resultant signal, and to calibrate the impedance of the load unit according to the resultant signal; and, the load unit comprises two adjustable resistance elements each coupled between the common voltage and one of the first output port and the second output port; and the reference voltage difference $D_{ref}$ and the reference current $I_{ref}$ satisfy:

$$D_{ref}=I_{ref} \times 2 \times Z;$$

wherein Z is a target impedance of each of the two adjustable resistance elements.

4. A driving circuit, comprising:
a reference current source for generating a reference current;
a load unit, coupled between a first output port and a second output port, wherein a bias voltage is applied onto the load unit;
a first switch unit, coupled between the first output port and the reference current source;
a second switch unit, coupled between the second output port and the reference current source;
a calibration module, for generating a control signal to calibrate an impedance of the load unit according to a voltage at one of the output ports while at least one of the first switch unit and the second switch unit is turned on;
wherein the bias voltage is distinct from the control signal generated by the calibration module; the calibration module is arranged to compare the voltage at one of the output ports with a predetermined reference voltage to generate a resultant signal, and to calibrate the impedance of the load unit according to the resultant signal; and, the load unit comprises two adjustable resistance elements each coupled between the bias voltage and one of the first output port and the second output port; and when one of the first switch unit and the second switch unit is turned on and the other is turned off, the predetermined reference voltage $V_{ref}$, the bias voltage $V_b$, and the reference current $I_{ref}$ satisfy:

$$V_{ref}=V_b-I_{ref} \times Z;$$

wherein Z is a target impedance of one of the adjustable resistance elements.

5. A driving circuit, comprising:
a reference current source for generating a reference current;
a load unit, coupled between a first output port and a second output port, wherein a bias voltage is applied onto the load unit;
a first switch unit, coupled between the first output port and the reference current source;
a second switch unit, coupled between the second output port and the reference current source;
a calibration module, for generating a control signal to calibrate an impedance of the load unit according to a voltage at one of the output ports while at least one of the first switch unit and the second switch unit is turned on;
wherein the bias voltage is distinct from the control signal generated by the calibration module; the calibration module is arranged to compare the voltage at one of the output ports with a predetermined reference voltage to generate a resultant signal, and to calibrate the impedance of the load unit according to the resultant signal; and, the load unit comprises two adjustable resistance elements each coupled between the bias voltage and one of the first output port and the second output port; and when the switch units are switched on, the predetermined reference voltage $V_{ref}$, the bias voltage $V_b$, and the reference current $I_{ref}$ satisfy:

$$V_{ref}=V_b-I_{ref} \times Z/2;$$

wherein Z is a target impedance of each of the adjustable resistance elements.

6. A method for calibrating an impedance of a load unit utilized in an H-box driving circuit, the H-box driving circuit including two first switch units each coupled between a first reference current source and one of a first output port and a second output port, two second switch units each coupled between a second reference current source and one of the first output port and the second output port, and the load unit coupled between the first output port and the second output port, wherein a common voltage is applied into the load unit, the method comprising:
turning on one of the two first switch units and one of the two second switch units, wherein the turned-on switch units are of the same phase;
injecting a reference current from the first reference current source to the second reference current source sequentially through the turned-on first switch unit, the load unit and the turned-on second switch unit; and
calibrating the impedance of the load unit according to a voltage at one of the output ports, wherein the voltage is generated due to the reference current, and the step of calibrating the impedance of the load unit comprises:
comparing the voltage at one of the output ports with a predetermined reference voltage to generate a resultant signal; and
calibrating the impedance of the load unit according to the resultant signal;
wherein the load unit comprises two adjustable resistance elements each coupled between the common voltage and one of the first output port and the second output port; and when the voltage at one of the output ports is located between the first reference current source and the common voltage, the common voltage $V_{cm}$, the predetermined reference voltage $V_{ref}$ and the reference current $I_{ref}$ satisfy:

$$V_{ref}=V_{cm}+I_{ref} \times Z;$$

wherein Z is a target impedance of one of the two adjustable resistance elements.

7. A method for calibrating an impedance of a load unit utilized in an H-box driving circuit, the H-box driving circuit including two first switch units each coupled between a first reference current source and one of a first output port and a second output port, two second switch units each coupled between a second reference current source and one of the first output port and the second output port, and the load unit coupled between the first output port and the second output port, wherein a common voltage is applied into the load unit, the method comprising:
turning on one of the two first switch units and one of the two second switch units, wherein the turned-on switch units are of the same phase;
injecting a reference current from the first reference current source to the second reference current source sequentially through the turned-on first switch unit, the load unit and the turned-on second switch unit; and
calibrating the impedance of the load unit according to a voltage at one of the output ports, wherein the voltage is generated due to the reference current, and the step of calibrating the impedance of the load unit comprises:

comparing the voltage at one of the output ports with a predetermined reference voltage to generate a resultant signal; and calibrating the impedance of the load unit according to the resultant signal;

wherein the load unit comprises two adjustable resistance elements each coupled between the common voltage and one of the first output port and the second output port; and when the voltage at one of the output ports is located between the common voltage and the second reference current source, the common voltage $V_{cm}$, the predetermined reference voltage $V_{ref}$, and the reference current $I_{ref}$ satisfy:

$$V_{ref}=V_{cm}-I_{ref}\times Z;$$

wherein Z is a target impedance of one of the two adjustable resistance elements.

8. A method for calibrating an impedance of a load unit utilized in an H-box driving circuit, the H-box driving circuit including two first switch units each coupled between a first reference current source and one of a first output port and a second output port, two second switch units each coupled between a second reference current source and one of the first output port and the second output port, and the load unit coupled between the first output port and the second output port, wherein a common voltage is applied into the load unit, the method comprising:

turning on one of the two first switch units and one of the two second switch units, wherein the turned-on switch units are of the same phase;

injecting a reference current from the first reference current source to the second reference current source sequentially through the turned-on first switch unit, the load unit and the turned-on second switch unit; and calibrating the impedance of the load unit according to a voltage at one of the output ports, wherein the voltage is generated due to the reference current, and the step of calibrating the impedance of the load unit according to the voltage at one of the output ports comprises:

comparing a voltage difference between the first and second output ports with a reference voltage difference to generate a resultant signal; and calibrating the impedance of the load unit according to the resultant signal;

wherein the load unit comprises two adjustable resistance elements each coupled between the common voltage and one of the first output port and the second output port; and the reference voltage difference $D_{ref}$ and the reference current $I_{ref}$ satisfy:

$$D_{ref}=I_{ref}\times 2\times Z;$$

wherein Z is a target impedance of each of the two adjustable resistance elements.

9. A method for calibrating an impedance of a load unit utilized in a driving circuit, the driving circuit including a reference current source for generating a reference current, the load unit coupled between a first output port and a second output port, a first switch unit coupled between the first output port and the reference current source, and a second switch unit coupled between the second output port and the reference current source, the method comprising:

applying a bias voltage onto the load unit;

turning on at least one of the first switch unit and the second switch unit; and generating a control signal to calibrate the impedance of the load unit according to a voltage at one of the output ports, and the step of calibrating the impedance of the load unit comprises:

comparing the voltage at one of the output ports with a predetermined reference voltage to generate a resultant signal; and calibrating the impedance of the load unit according to the resultant signal;

wherein the bias voltage is distinct from the control signal; and, the load unit comprises two adjustable resistance elements each coupled between the bias voltage and one of the first output port and the second output port; and when the voltage at one of the output ports is located between the reference current source and the bias voltage, the predetermined reference voltage $V_{ref}$, the bias voltage $V_b$, and the reference current $I_{ref}$ satisfy:

$$V_{ref}=V_b-I_{ref}\times Z;$$

wherein Z is a target impedance of one of the adjustable resistance elements.

10. A method for calibrating an impedance of a load unit utilized in a driving circuit, the driving circuit including a reference current source for generating a reference current, the load unit coupled between a first output port and a second output port, a first switch unit coupled between the first output port and the reference current source, and a second switch unit coupled between the second output port and the reference current source, the method comprising:

applying a bias voltage onto the load unit;

turning on at least one of the first switch unit and the second switch unit; and generating a control signal to calibrate the impedance of the load unit according to a voltage at one of the output ports, and the step of calibrating the impedance of the load unit comprises:

comparing the voltage at one of the output ports with a predetermined reference voltage to generate a resultant signal; and calibrating the impedance of the load unit according to the resultant signal;

wherein the bias voltage is distinct from the control signal; and, the load unit comprises two adjustable resistance elements each coupled between the bias voltage and one of the first output port and the second output port; and when the switch units are switched on, the predetermined reference voltage $V_{ref}$, the bias voltage $V_b$, and the reference current $I_{ref}$ satisfy:

$$V_{ref}=V_b-I_{ref}\times Z/2;$$

wherein Z is a target impedance of each of the adjustable resistance elements.

* * * * *